US012369252B2

(12) United States Patent
Miki et al.

(10) Patent No.: US 12,369,252 B2
(45) Date of Patent: Jul. 22, 2025

(54) CIRCUIT MODULE AND LARGE-SCALE CIRCUIT SYSTEM

(71) Applicant: Murata Manufacturing Co., Ltd., Kyoto-fu (JP)

(72) Inventors: Osamu Miki, Nagaokakyo (JP); Tatsuya Hosotani, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 319 days.

(21) Appl. No.: 18/313,180

(22) Filed: May 5, 2023

(65) Prior Publication Data

US 2023/0276573 A1 Aug. 31, 2023

Related U.S. Application Data

(63) Continuation of application No. PCT/JP2021/040473, filed on Nov. 3, 2021.

(30) Foreign Application Priority Data

Nov. 16, 2020 (JP) ................................. 2020-190082

(51) Int. Cl.
*H05K 1/14* (2006.01)
*H02M 3/00* (2006.01)
*H05K 1/18* (2006.01)

(52) U.S. Cl.
CPC .............. *H05K 1/14* (2013.01); *H02M 3/003* (2021.05); *H05K 1/181* (2013.01); *H05K 2201/044* (2013.01)

(58) Field of Classification Search
CPC .... H05K 1/14; H05K 1/181; H05K 2201/044; H02M 3/003

USPC ......................................................... 361/760
See application file for complete search history.

(56) References Cited

U.S. PATENT DOCUMENTS 10,264,664 B1 * 4/2019 Vinciarelli ........... H05K 3/0026

FOREIGN PATENT DOCUMENTS

| JP | 2003-518759 A | 6/2003 |
| JP | 2004-079776 A | 3/2004 |
| JP | 2015-060923 A | 3/2015 |

(Continued)

OTHER PUBLICATIONS

International Search Report issued in PCT/JP2021/040473; mailed Jan. 25, 2022.

*Primary Examiner* — Binh B Tran
(74) *Attorney, Agent, or Firm* — Studebaker Brackett PLLC

(57) ABSTRACT

A circuit module includes a circuit module substrate having an area smaller than a large-scale circuit board, an electronic circuit component mounted on the circuit module substrate, a connection pin provided to the circuit module substrate, and a circuit-module-substrate-side fitting structure part provided to the circuit module substrate. A pin receptacle and the connection pin are electrically connected to each other. A non-conductive thermal adhesive layer is formed between a surface of the circuit module substrate and a surface of a base material of the large-scale circuit board facing to each other, the non-conductive thermal adhesive layer electrically insulating and thermally joining the surfaces by a non-conductive thermally conductive material.

20 Claims, 6 Drawing Sheets

(56) References Cited

FOREIGN PATENT DOCUMENTS

| | | |
|---|---|---|
| JP | 2016-122796 A | 7/2016 |
| JP | 2017-099035 A | 6/2017 |

\* cited by examiner

CIRCUIT MODULE AND LARGE-SCALE CIRCUIT SYSTEM

CROSS-REFERENCE TO RELATED APPLICATIONS

This application claims benefit of priority to International Patent Application No. PCT/JP2021/040473, filed Nov. 3, 2021, and to Japanese Patent Application No. 2020-190082, filed Nov. 16, 2020, the entire contents of each are incorporated herein by reference.

BACKGROUND

Technical Field

The present disclosure relates to a circuit module substrate to be attached to a large-scale circuit board, and particularly, to a circuit module substrate to be attached to a large-scale circuit board without using solder and a large-scale circuit system provided with the circuit module substrate.

Background Art

Japanese Unexamined Patent Application Publication No. 2015-060923 relates to an electronic module including a circuit board and an electronic component mounted on the circuit board, and discloses an electronic module in which a heat sink is provided to a lower surface of the circuit board to be opposed thereto and a thermal conductor is filled between a lower surface of a winding coil component and an upper surface of the circuit board.

SUMMARY

When a circuit module including a module substrate is mounted on, for example, a back surface of a large-scale circuit board, generally, the module substrate is temporarily fixed to the large-scale board by adhesive or the like, to prevent the module substrate from falling, and then, is passed through a reflow oven to perform soldering.

On the other hand, when a circuit module in a non-molded state is mounted on a back surface of a large-scale circuit board in order to reduce height and assembly cost, for example, since each component constituting the circuit module has already been mounted by soldering, the solder attaching the component constituting the circuit module remelts when the circuit module is mounted on the large-scale circuit board. Therefore, there is a problem in that a position of the component may offset or the component may fall under its own weight, for example.

Therefore, technique to mount the non-molded circuit module to the large-scale circuit board is required.

It can be considered to prevent remelting of the solder during reflow soldering of the large-scale circuit board by each component constituting the circuit module being mounted using a high melting point solder. However, since it limits heat resistance of the component and a choice of solders, it is not realistic.

Moreover, it can also be considered to mount a circuit module using a low melting point solder on a large-scale circuit board on which a circuit component has already been mounted. However, in the case of using the low melting point solder, if the solder melts even for a moment due to generation of heat of the circuit during actual operation, connection failure of the component may occur, which leads to a significant problem in terms of reliability. Such a problem is likely to appear when, for example, a heat-generating component such as a processor is mounted near the circuit module or the circuit module is provided with a component having a high self-heating property.

On the other hand, as a connection method alternative to the solder, there is a connection method using conductive paste containing metal filler, such as silver paste. Although conductive paste containing a large amount of metal filler may be used to increase conductivity, there is a limit since adhesive strength becomes weaker. That is, conductivity and adhesive strength have trade-off relationship.

Therefore, the present disclosure provides realize high reliability and superior electric characteristics in a large-scale circuit system in which a circuit module is mounted on a large-scale circuit board, without using soldering.

A circuit module as an example of the present disclosure includes a circuit module substrate mounted on a large-scale circuit board and having an area smaller than the large-scale circuit board, the large-scale circuit board having a large-scale-circuit-board-side fitting structure part; an electronic circuit component mounted on the circuit module substrate; a plurality of circuit-module-substrate-side connection terminals provided to the circuit module substrate; and a circuit-module-substrate-side fitting structure part provided to the circuit module substrate. The plurality of circuit-module-substrate-side connection terminals include an electric signal terminal constituting an electric signal path, and a high current terminal constituting a high current path of a power system. The plurality of circuit-module-substrate-side connection terminals are electrically connected to a plurality of large-scale-circuit-board-side connection terminals provided to the large-scale circuit board. The circuit-module-substrate-side fitting structure part and the large-scale-circuit-board-side fitting structure part are electrically connected and mechanically fixed to each other. A non-conductive thermal adhesive layer is formed between a surface of the circuit module substrate and a surface of a base material of the large-scale circuit board facing to each other, the non-conductive thermal adhesive layer electrically insulating and thermally joining the surfaces by a non-conductive thermally conductive material.

A large-scale circuit system of the present disclosure includes the circuit module described above and the large-scale circuit board on which the circuit module is mounted.

According to the present disclosure, high reliability and superior electric characteristics can be realized in the structure in which the circuit module is mounted on the large-scale circuit board, without using soldering.

DETAILED DESCRIPTION

Figure 1:
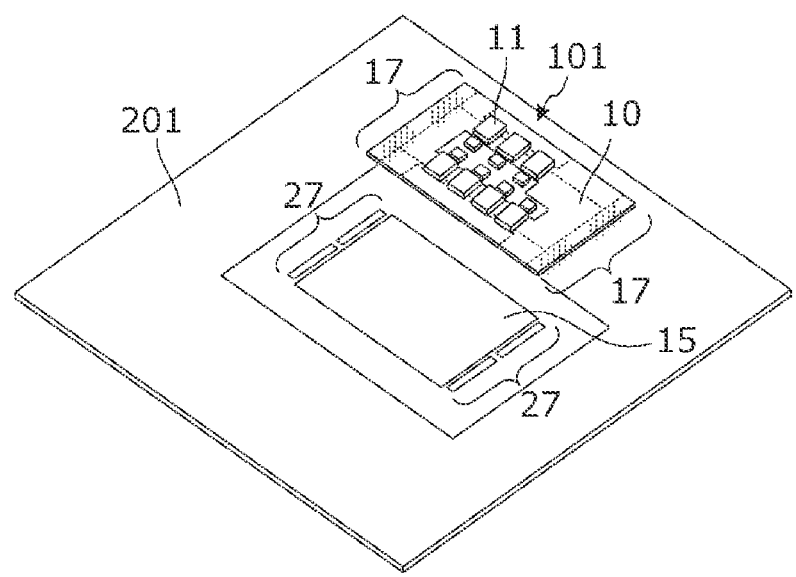
FIG. 1 is a perspective view of a circuit module according to Embodiment 1 and a large-scale circuit board on which the circuit module is mounted.

Hereinafter, a plurality of embodiments which embody the present disclosure are described by giving some concrete examples with reference to the drawings. In the drawings, the same reference characters are given to the same components. Although the embodiment is described while separating into the plurality of embodiments for convenience considering easiness of description and understanding of main points, partial replacement or combination of configurations described in different embodiments is possible. In Embodiment 2 and thereafter, description about points common with Embodiment 1 is omitted, and only different points are described. Particularly, similar operation and effects brought by similar configuration is not mentioned one by one in each of the embodiments.

Embodiment 1

Figure 2:
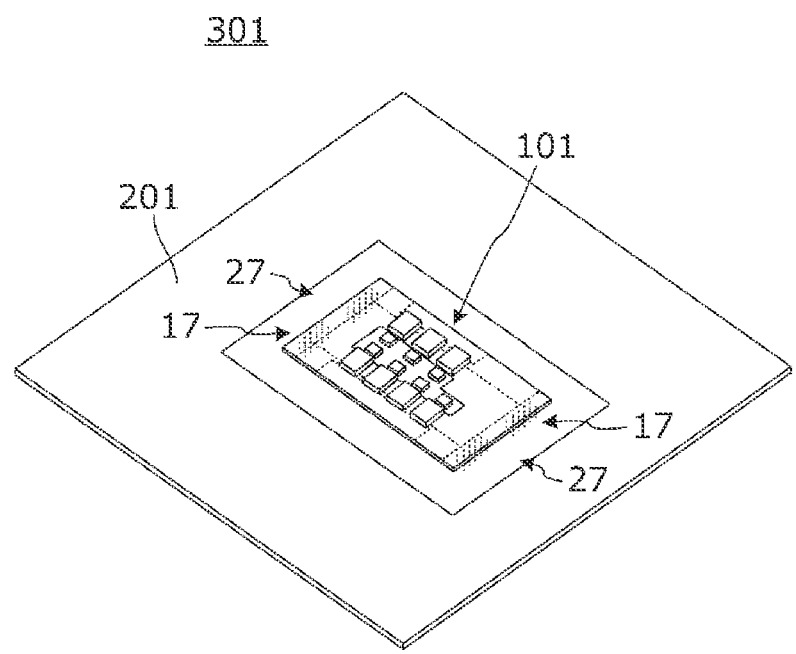
FIG. 2 is a perspective view of a large-scale circuit system in a state where the circuit module is mounted on the large-scale circuit board.

FIG. 1 is a perspective view of a circuit module 101 according to Embodiment 1 and a large-scale circuit board 201 on which the circuit module 101 is mounted. FIG. 2 is a perspective view of a large-scale circuit system 301 in a state where the circuit module 101 is mounted on the large-scale circuit board 201.

The large-scale circuit board 201 is, for example, a system board for a server, and various electronic components including a processor is mounted on the large-scale circuit board 201. FIGS. 1 and 2 are perspective views when the large-scale circuit board 201 is seen from a back surface side, and the various electronic components including the processor are mounted on a front surface (a back surface in FIGS. 1 and 2) of the large-scale circuit board 201.

As illustrated in FIG. 1, the circuit module 101 is provided with a circuit module substrate 10 having an area smaller than the large-scale circuit board 201. The circuit module 101 is, for example, a power supply circuit module, and is connected to the processor at the shortest distance.

The circuit module 101 is provided with the circuit module substrate 10, an electronic circuit component 11 mounted on the circuit module substrate 10, and a circuit-module-substrate-side fitting structure part 17 provided to the circuit module substrate 10.

The large-scale circuit board 201 is provided with a large-scale-circuit-board-side fitting structure part 27. Moreover, a non-conductive thermal adhesive layer 15 is formed on a surface of the large-scale circuit board 201, the surface facing to the circuit module substrate 10.

As illustrated in FIG. 2, the circuit-module-substrate-side fitting structure part 17 and the large-scale-circuit-board-side fitting structure part 27 are electrically connected and mechanically fixed to each other. Moreover, a surface of the circuit module substrate 10 and a surface of the large-scale circuit board 201 facing to each other are electrically insulated from and thermally joined to each other by the non-conductive thermal adhesive layer 15.

Figure 3A:
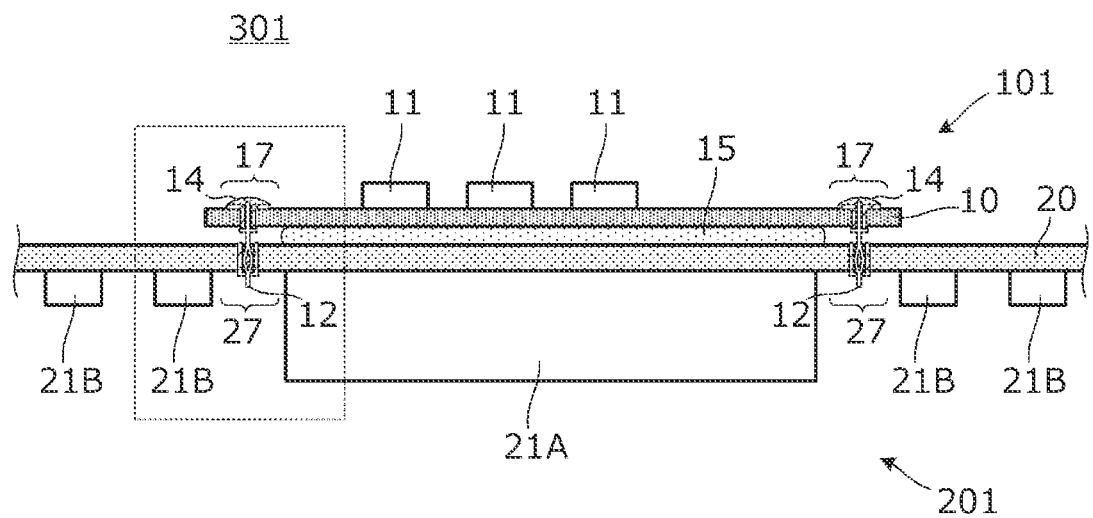
FIG. 3A is a sectional view of the large-scale circuit system in a state where the circuit module is mounted on the large-scale circuit board.
Figure 3B:
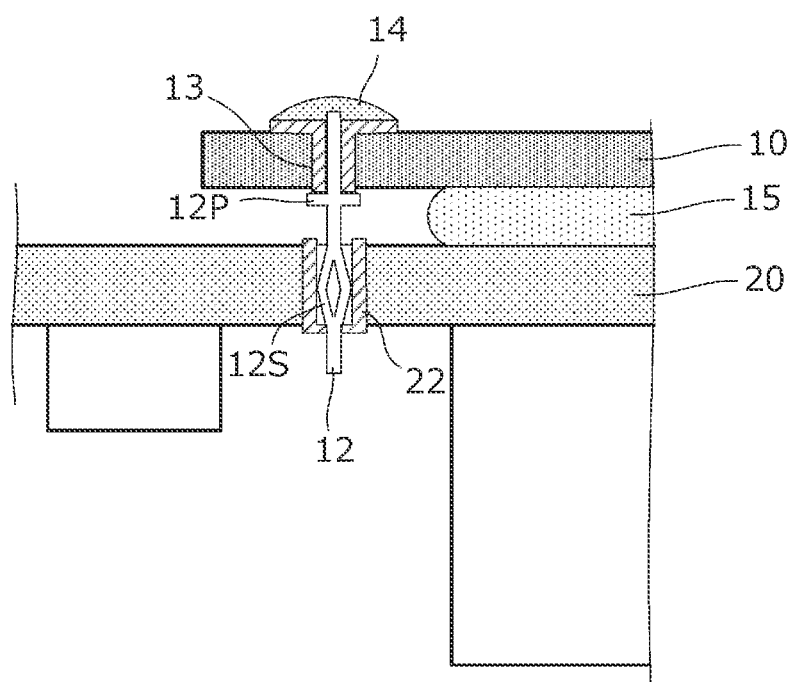
FIG. 3B is an enlarged view of a part surrounded by a broken line in FIG. 3A.

FIG. 3A is a sectional view of the large-scale circuit system 301 in a state where the circuit module 101 is mounted on the large-scale circuit board 201. FIG. 3B is an enlarged view of a part surrounded by a broken line in FIG. 3A.

On a front surface (a lower surface in FIGS. 3A and 3B) of a base material 20 of the large-scale circuit board 201, large-scale-circuit-board-side electronic components 21A and 21B are mounted. The large-scale-circuit-board-side electronic component 21A is a processor, for example.

A plurality of through vias 13 are formed in the circuit module substrate 10 of the circuit module 101. Connection pins 12 are inserted into the respective through vias 13 from a lower surface of the circuit module substrate 10 (a surface opposite from the surface on which the electronic circuit component 11 is mounted). As illustrated in FIG. 3B, the connection pin 12 has a protrusion 12P which contacts the circuit module substrate 10. The through via 13 is a copper film formed on an inner wall surface of a cylindrical through hole formed in the circuit module substrate 10. One end of the connection pin 12 projects from the upper surface of the circuit module substrate 10, and the projecting portion is soldered by a solder 14. The connection pin 12 is one example of a "circuit-module-substrate-side connection terminal" according to the present disclosure.

A plurality of pin receptacles 22 are formed in the base material 20 of the large-scale circuit board 201. The connection pin 12 of the circuit module 101 is inserted into the pin receptacle 22 to be fitted therein. Therefore, the connection pin 12 is electrically connected and mechanically fixed to the pin receptacle 22. The connection pin 12 has a spring portion 12S and elastically contacts the pin receptacle 22.

The connection pin 12, the through via 13, and the solder 14 on the circuit module 101 side constitute the circuit-module-substrate-side fitting structure part 17. Moreover, the pin receptacle 22 on the large-scale circuit board 201 side constitutes the large-scale-circuit-board-side fitting structure part 27.

The non-conductive thermal adhesive layer 15 is formed on the surface of the base material 20 of the large-scale circuit board 201, the surface facing to the circuit module substrate 10. The non-conductive thermal adhesive layer 15 is configured by a non-conductive thermally conductive material. The non-conductive thermal adhesive layer 15 is interposed between the surface of the circuit module substrate 10 and the surface of the base material 20 of the large-scale circuit board 201 facing to each other, thus thermally joining the circuit module substrate 10 and the base material 20 of the large-scale circuit board 201 in an electrically insulated state. An adhesive material for a heat sink (a thermal interface material (TIM)) may be used for the non-conductive thermal adhesive layer 15.

Procedure for manufacturing the large-scale circuit system 301 is as follows.

(1) The connection pin 12 is inserted into the circuit module substrate 10 and is soldered.
(2) The non-conductive thermal adhesive layer 15 is applied to the large-scale circuit board 201.
(3) The connection pin 12 of the circuit module 101 is inserted into the pin receptacle 22 of the large-scale circuit board 201 to be fitted therein.
(4) The non-conductive thermal adhesive layer 15 is solidified by the large-scale circuit board 201 and the circuit module 101 being left as they are for a given period of time in an atmosphere at a given temperature.

Note that the non-conductive thermal adhesive layer 15 may be applied to the circuit module 101 side. Moreover, the pin receptacle 22 may be a through via.

The plurality of connection pins 12 include an electric signal terminal which constitutes an electric signal path, and a high current terminal which constitutes a high current path of a power system. Current which flows in the high current path is one hundred or more times as high as current which flows in the electric signal path.

A circuit configured by the circuit module substrate 10 while including the electronic circuit component 11 mounted on the circuit module substrate 10 constitutes a DC/DC converter. The DC/DC converter receives power from a circuit formed in or on the large-scale circuit board 201, and outputs direct-current voltage to the large-scale circuit board 201 by supplying high current thereto. A thin planar-array winding inductor is formed or a molded inductor is mounted on the circuit module substrate 10, and a switching element and a smoothing capacitor are mounted on the circuit module substrate 10.

In FIG. 2, the circuit-module-substrate-side fitting structure part 17 and the large-scale-circuit-board-side fitting structure part 27 are both located on two sides of the circuit module substrate 10 opposing to each other. One of the two sides is an input part of the DC/DC converter, and the other one of the two sides is an output part of the DC/DC converter. The electronic circuit component 11 is, for example, a switching element such as a MOS-FET. The DC/DC converter is mainly a power supply circuit for the large-scale-circuit-board-side electronic component 21A (processor). The DC/DC converter serves as a point of load (POL) converter which supplies high current exceeding several-dozen amperes or several-hundred amperes to the processor, for example. Since the DC/DC converter is disposed such that a distance to the processor becomes the shortest while sandwiching the base material 20 of the large-scale circuit board 201 therebetween, power loss due to a resistance component in a line of the high current exceeding several-dozen amperes or several-hundred amperes becomes the minimum.

The DC/DC converter receives input of, for example, 48 VDC or 12 VDC from the large-scale circuit board 201, steps it down to 6 VDC to 1 VDC or to 1.8 VDC to 0.5 VDC, and gives it to the processor.

The MOS-FET and the inductor of the circuit module 101 generate heat due to power loss. However, since the circuit module 101 is thermally joined to the large-scale circuit board 201 with the non-conductive thermal adhesive layer 15 interposed therebetween, heat capacity combining the circuit module 101 and the large-scale circuit board 201 is large, and heat dissipation of the heat generated in the circuit module 101 is large.

In the example described above, the connection pin 12 on the circuit module 101 side is inserted into the pin receptacle 22 of the large-scale circuit board 201. However, a frame may be provided to the circuit module 101 side, and a frame socket into which the frame is inserted may be provided to the large-scale circuit board 201, or the frame may be inserted to the large-scale circuit board 201 side so as to mechanically be fixed to the large-scale circuit board 201.

In this embodiment, since the circuit module is not molded, it can be made thin as a whole and cost can be reduced. Moreover, without molding, the surfaces of the circuit module substrate 10 and the large-scale circuit board 201 facing to each other are planarly joined together with the non-conductive thermal adhesive layer 15 interposed therebetween, and thus heat distribution is equalized in a plane direction and a heat dissipation effect of the circuit module 101 is large.

Moreover, since the non-conductive thermal adhesive layer 15 is a solidified layer of the liquid TIM, adhesion property of the circuit module 101 to the large-scale circuit board 201 is high. Therefore, for example, fixing the circuit module 101 to the large-scale circuit board 201 by a screw is unnecessary. Further, when compared to a structure in which the large-scale circuit board 201 and the circuit module 101 are fixed together using a screw with a thermally conductive silicon sheet interposed therebetween, higher thermal conductivity can be achieved. The thermal conductivity of the silicon sheet is 1 W/mK whereas the thermal conductivity of the non-conductive thermal adhesive layer 15 is 2 W/mK.

Moreover, by the large-scale circuit board 201 and the circuit module 101 being joined together with the non-conductive thermal adhesive layer 15 being interposed therebetween, a holding force of the connection pin 12 to the pin receptacle 22 is strengthened.

As described above, in the configuration of this embodiment, the circuit module which is mountable on the large-scale circuit board in the method other than soldering and has the non-molded circuit substrate structure and the large-scale circuit system in which the circuit module is mounted on the large-scale circuit board are obtained. Moreover, conduction of high current one hundred or more times as high as current which is flowed to the plurality of circuit-module-substrate-side connection terminals, connection of electric signals, mechanical fixing, and equalization of heat distribution can be realized at the same time.

Embodiment 2

In Embodiment 2, an example of a circuit module and a large-scale circuit system are described in which, regarding an electrical connection part of a circuit module to a large-scale circuit board, structures are different between an electric signal system which transmits a control signal or the like and a power system which supplies high current one hundred or more times as high as current flowed to the electric signal system.

Figure 4:
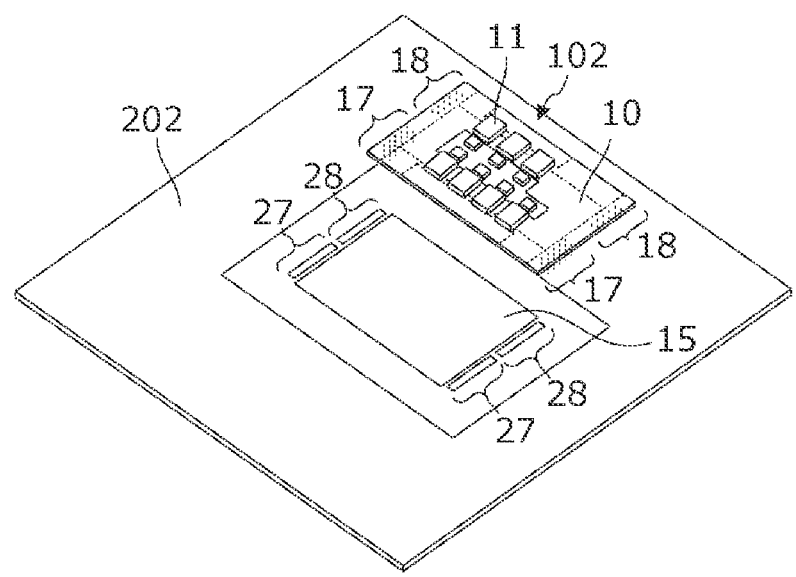
FIG. 4 is a perspective view of a circuit module according to Embodiment 2 and a large-scale circuit board on which the circuit module is mounted.

FIG. 4 is a perspective view of a circuit module 102 according to Embodiment 2 and a large-scale circuit board 202 on which the circuit module 102 is mounted. Similarly to the example described in Embodiment 1, FIG. 4 is a perspective view when the large-scale circuit board 202 is seen from a back surface side, and various electronic components including a processor are mounted on a front surface (a back surface in FIG. 4) of the large-scale circuit board 202.

The circuit module 102 is provided with the circuit module substrate 10, the electronic circuit component 11 mounted on the circuit module substrate 10, the circuit-module-substrate-side fitting structure part 17 provided to the circuit module substrate 10, and a circuit-module-substrate-side connection part 18.

The large-scale circuit board 202 is provided with the large-scale-circuit-board-side fitting structure part 27 and a large-scale-circuit-board-side connection part 28. Moreover, the non-conductive thermal adhesive layer 15 is formed on a surface of the large-scale circuit board 202, the surface facing to the circuit module substrate 10.

The circuit-module-substrate-side fitting structure part 17 and the large-scale-circuit-board-side fitting structure part 27 are electrically connected and mechanically fixed to each other. Moreover, the circuit-module-substrate-side connection part 18 and the large-scale-circuit-board-side connection part 28 are electrically connected to each other. The surface of the circuit module substrate 10 and the surface of the large-scale circuit board 202 facing to each other are electrically insulated from and thermally joined to each other by the non-conductive thermal adhesive layer 15.

Figure 5A:
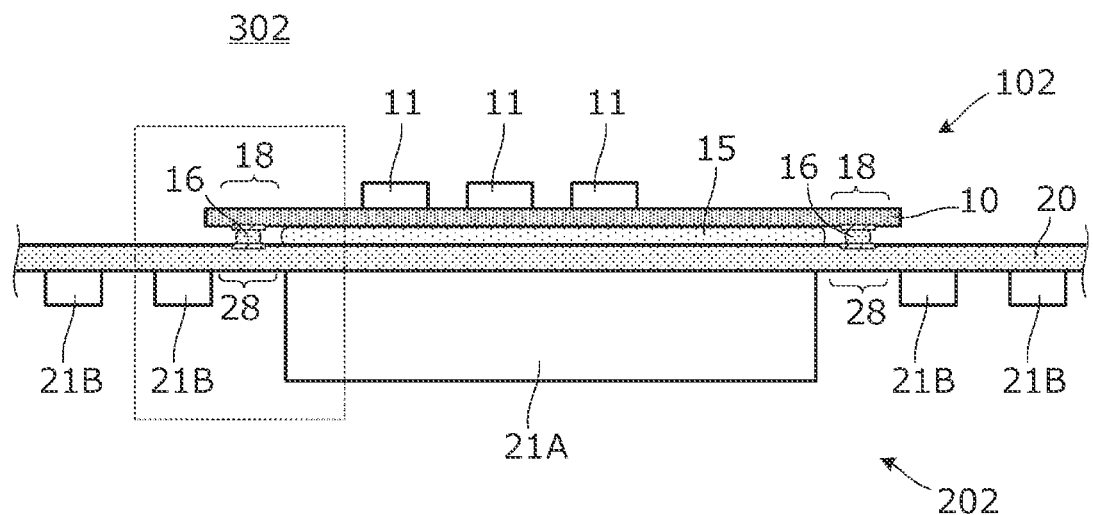
FIG. 5A is a sectional view of a large-scale circuit system in a state where the circuit module is mounted on the large-scale circuit board.
Figure 5B:
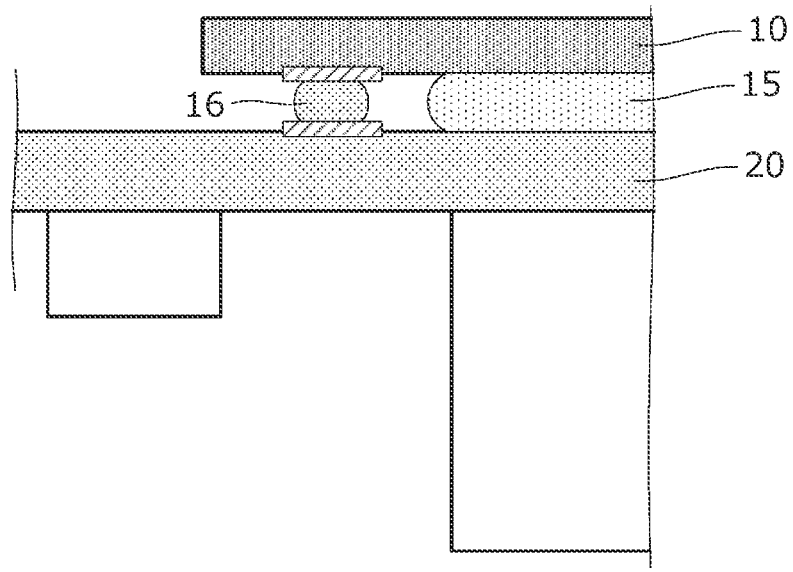
FIG. 5B is an enlarged view of a part surrounded by a broken line in FIG. 5A.

FIG. 5A is a sectional view of the large-scale circuit system 302 in a state where the circuit module 102 is mounted on the large-scale circuit board 202. The position of the cross-section is a plane passing though the circuit-module-substrate-side connection part 18 and the large-scale-circuit-board-side connection part 28 illustrated in FIG. 4. FIG. 5B is an enlarged view of a part surrounded by a broken line in FIG. 5A.

On a front surface (a lower surface in FIGS. 5A and 5B) of the base material 20 of the large-scale circuit board 202, the large-scale-circuit-board-side electronic components 21A and 21B are mounted. The large-scale-circuit-board-side electronic component 21A is a processor, for example.

The large-scale-circuit-board-side connection part 28 of the large-scale circuit board 202 is provided with a plurality of conductive joining parts 16 by application of conductive paste. The circuit-module-substrate-side connection part 18 of the circuit module 102 is electrically connected to the large-scale-circuit-board-side connection part 28 of the large-scale circuit board 202 with the conductive joining part 16 interposed therebetween.

The non-conductive thermal adhesive layer 15 and the conductive joining part 16 are solidified bodies of paste containing main material of the same system, and the conductive joining part 16 is a solidified body of conductive paste containing conductive filler as the main material. The conductive filler is, for example, silver powder or copper powder. Non-conductive thermal adhesive filler is, for example, powder of alumina or aluminum nitride. Moreover, the main material is, for example, epoxy resin.

The circuit module substrate 10 is a glass epoxy substrate, or an aluminum nitride substrate or an alumina substrate suitable for the conductive paste.

Current which flows in the circuit-module-substrate-side fitting structure part 17 is one hundred or more times as high as current which flows in the plurality of circuit-module-substrate-side connection parts 18.

Procedure for manufacturing a large-scale circuit system 302 is as follows.

(1) The connection pin 12 is inserted into the circuit module substrate 10 and is soldered.
(2) The conductive paste for formation of the conductive joining part 16 is applied to the circuit module substrate 10.
(3) The non-conductive thermal adhesive layer 15 is applied to the large-scale circuit board 202.
(4) The connection pin 12 of the circuit module 102 is inserted into the pin receptacle 22 of the large-scale circuit board 202 to be fitted therein.
(5) The non-conductive thermal adhesive layer 15 is solidified by the large-scale circuit board 202 and the circuit module 102 being left as they are for a given period of time in an atmosphere at a given temperature. Moreover, the conductive paste is solidified to form the conductive joining part 16.

In this embodiment, the circuit-module-substrate-side fitting structure part 17 and the large-scale-circuit-board-side fitting structure part 27 are fitting structure parts of the power system which supplies high current one hundred or more times as high as the current flowed to the electric signal system. Moreover, the circuit-module-substrate-side connection part 18 and the large-scale-circuit-board-side connection part 28 are connection parts of the electric signal system. Further, the conductive joining part 16 is a solidified part of the conductive paste having a thermal conductivity higher than the non-conductive thermal adhesive layer 15. The electric signal is, for example, a control signal to the DC/DC converter and a signal indicative of a state of the DC/DC converter.

In this embodiment, at the connection part of the power system which supplies high current one hundred or more times as high as the current flowed to the electric signal system, power loss due to a resistance component in its path can be reduced, and at the connection part of the electric signal system, its installation pitch can be made smaller and densification in a plane direction may be obtained.

Embodiment 3

In Embodiment 3, an example of a circuit configured by a circuit module is described.

Figure 6:
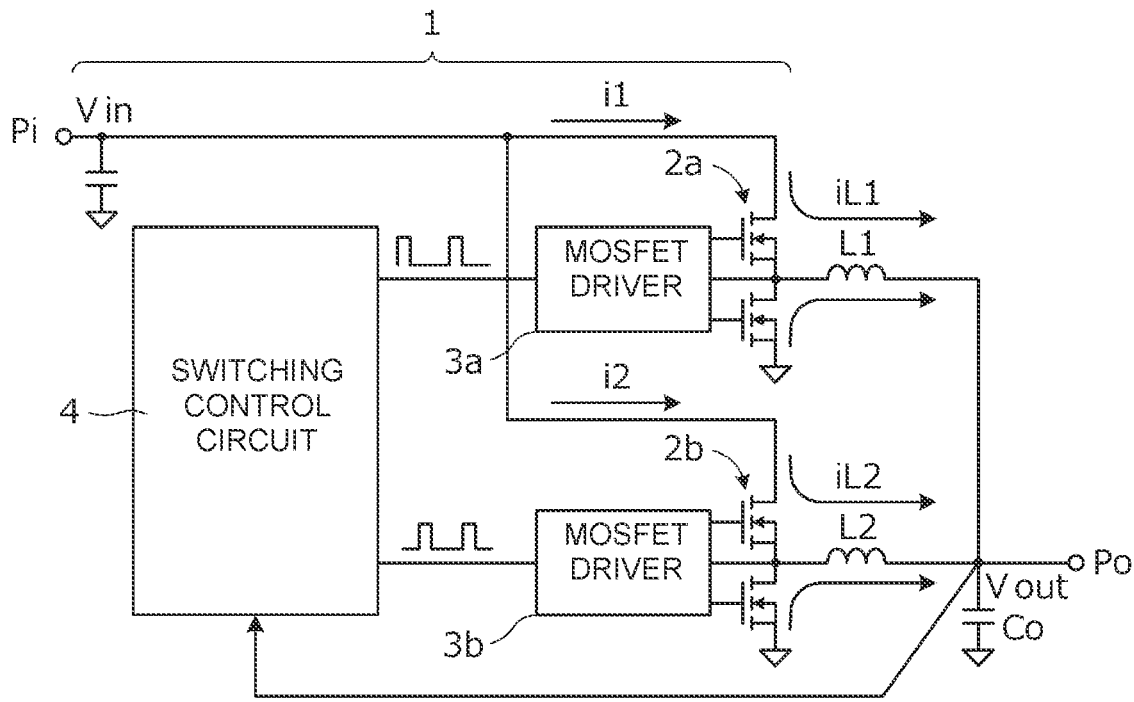
FIG. 6 is a circuit diagram of a DC/DC converter according to Embodiment 3.

FIG. 6 is a circuit diagram of a DC/DC converter according to Embodiment 3. This DC/DC converter steps down an input voltage Vin inputted from an input part Pi, and outputs an output voltage Vout from an output part Po. The DC/DC converter includes planar array winding coils constituting inductors L1 and L2, and a power conversion circuit 1. Switching circuit parts 2a and 2b of the power conversion circuit 1 are each configured by a high-side MOS-FET and a low-side MOS-FET. A first end of the inductor L1 is connected to an output part of the switching circuit part 2a, and a second end of the inductor L1 is connected to the common output part Po. A first end of the inductor L2 is connected to an output part of the switching circuit part 2b, and a second end of the inductor L2 is connected to the common output part Po. A smoothing capacitor Co is connected to the output part Po.

A drive circuit 3a is connected between a gate and a source of the MOS-FET of the switching circuit part 2a, and a drive circuit 3b is connected between a gate and a source of the MOS-FET of the switching circuit part 2b.

A switching control circuit 4 is connected to the drive circuits 3a and 3b. The switching control circuit 4 outputs, to the drive circuits 3a and 3b, two-phase drive signals having phase difference of 180 degrees.

Figure 7:
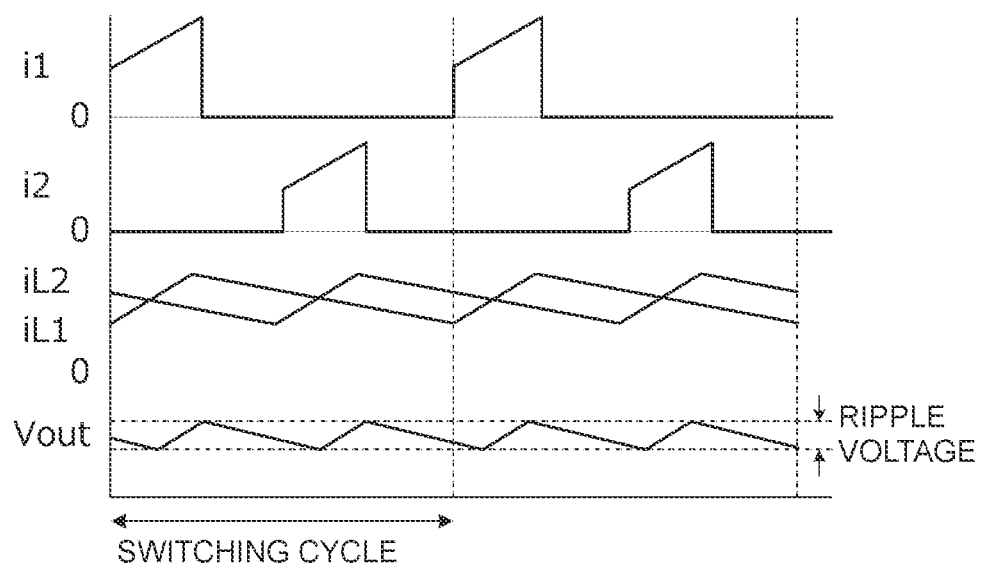
FIG. 7 is a waveform chart of voltage and current in each part of a switched-mode power supply unit illustrated in FIG. 6.

FIG. 7 is a waveform chart of voltage and current in each part of a switched-mode power supply unit illustrated in FIG. 6. In FIG. 7, the voltage Vin is the input voltage. A current i1 is an input current flowing in the switching circuit part 2a, and a current i2 is an input current flowing in the switching circuit part 2b. Moreover, a current iL1 is a current flowing in the inductor L1, and a current iL2 is a current flowing in the inductor L2. The voltage Vout is the output voltage of the output part Po.

A phase difference of current waveforms of the input currents i1 and i2 is 180 degrees, and a phase difference of current waveforms flowing in the inductors L1 and L2 is also 180 degrees. The example illustrated in FIGS. 6 and 7 is a two-phase switched-mode power supply unit using two inductors. Therefore, two sets of switching operation are performed during one switching cycle, and two waveforms indicative of excitation current in the inductor current can be confirmed.

Figure 8:
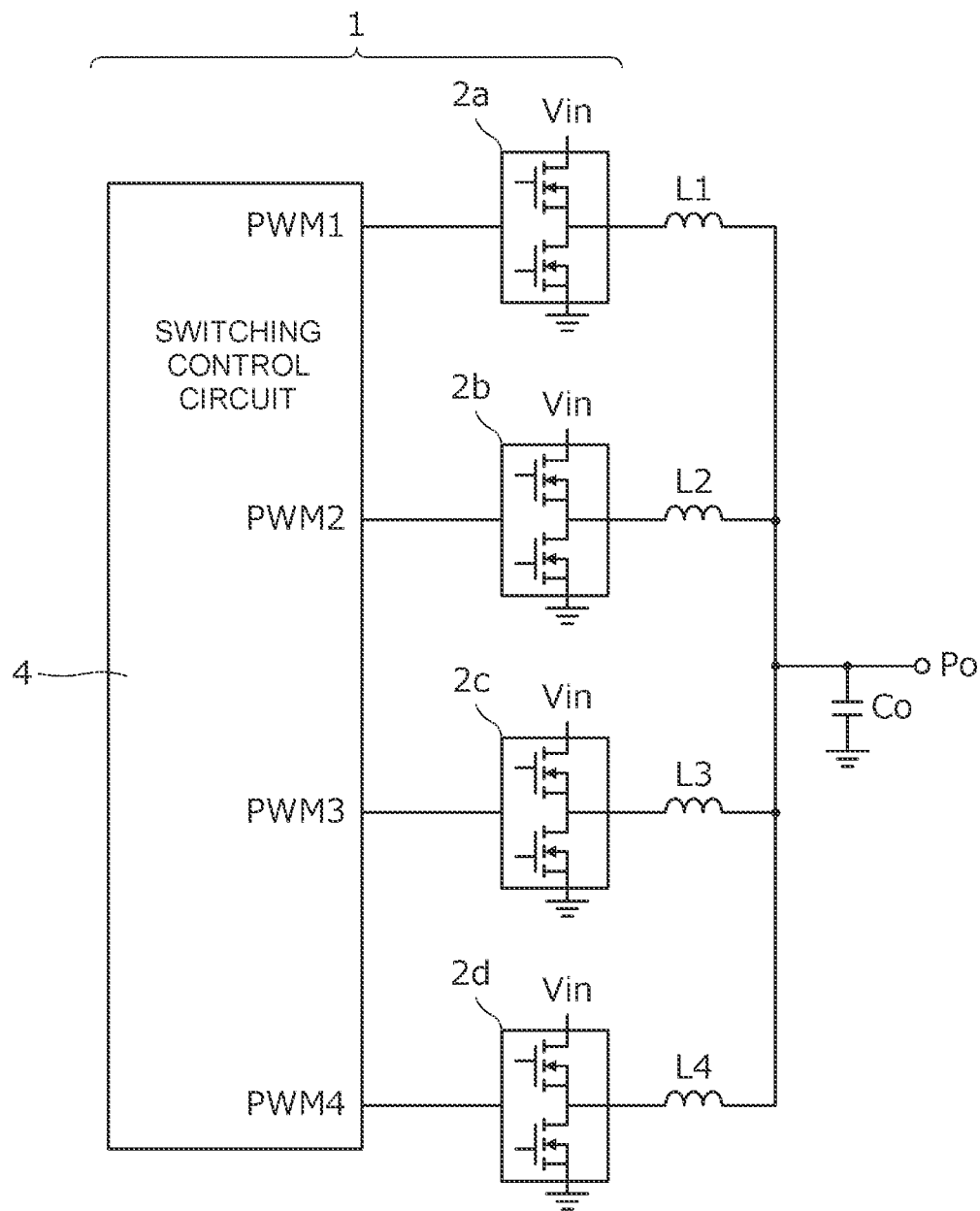
FIG. 8 is a circuit diagram of a DC/DC converter provided with four inductors and a power conversion circuit.

FIG. 8 is a circuit diagram of a DC/DC converter provided with four inductors L1, L2, L3, and L4, each configured by a winding coil, and the power conversion circuit 1. Switching circuit parts 2a, 2b, 2c, and 2d of the power conversion circuit 1 are each configured by a high-side MOS-FET and a low-side MOS-FET. First ends of the inductors L1, L2, L3, and L4 are connected to respective output parts of the switching circuit parts 2a, 2b, 2c, and 2d, and second ends of the inductors L1, L2, L3, and L4 are connected to the common output part Po.

A drive circuit (not illustrated) is connected to each of the switching circuit parts 2a, 2b, 2c, and 2d, and the switching control circuit 4 is connected to the drive circuits. The switching control circuit 4 outputs, to the drive circuits, four-phase drive signals having a phase difference of 90 degrees.

In such a four-phase switched-mode power supply unit, a phase difference of the input current waveforms flowing in the switching circuit parts 2a, 2b, 2c, and 2d is 90 degrees, and a phase difference of the current waveforms flowing in the inductors L1, L2, L3, and L4 is also 90 degrees. Therefore, four sets of switching operation are performed during one switching cycle, and four waveforms indicative of excitation current in the inductor current can be confirmed.

The switching control circuit 4 illustrated in FIG. 8 is a multi-phase PWM controller, and can also control the number of switching circuit parts to be used among the plurality of switching circuit parts 2a to 2d depending on the load. That is, it operates in a single phase at the minimum load, operates in four phases at the maximum load, and operates in two or three phases at an intermediate load.

Although the example illustrated in FIG. 8 is a multi-phase DC/DC converter in four phases at the maximum, a multi-phase DC/DC converter in further more phases may be configured similarly.

Lastly, the present disclosure is not limited to the embodiments described above, but may suitably be modified or changed by persons skilled in the art. The scope of the present disclosure is indicated not by the embodiments described above but by the claims. Further, the scope of the present disclosure includes modification and changes from the embodiments within the claims and the equivalent thereof.

What is claimed is:

1. A circuit module comprising:
a circuit module substrate mounted on a large-scale circuit board and having an area smaller than the large-scale circuit board, the large-scale circuit board having a large-scale-circuit-board-side fitting structure part;
an electronic circuit component mounted on the circuit module substrate;
a plurality of circuit-module-substrate-side connection terminals at the circuit module substrate; and
a circuit-module-substrate-side fitting structure part at the circuit module substrate, wherein
the plurality of circuit-module-substrate-side connection terminals include an electric signal terminal configuring an electric signal path, and a high current terminal configuring a high current path of a power system,
the plurality of circuit-module-substrate-side connection terminals are electrically connected to a plurality of large-scale-circuit-board-side connection terminals at the large-scale circuit board,
the circuit-module-substrate-side fitting structure part and the large-scale-circuit-board-side fitting structure part are electrically connected and mechanically fixed to each other, and
a non-conductive thermal adhesive layer is between a surface of the circuit module substrate and a surface of a base material of the large-scale circuit board facing to each other, the non-conductive thermal adhesive layer electrically insulating and thermally joining the surface of the circuit module substrate and the surface of the base material by a non-conductive thermally conductive material.

2. The circuit module according to claim 1, wherein
the circuit-module-substrate-side fitting structure part is a pin or a frame configured to fit with the large-scale-circuit-board-side fitting structure part.

3. The circuit module according to claim 1, wherein
the circuit-module-substrate-side fitting structure part configures the electric signal path and the high current path of the power system, and current that flows in the high current path is one hundred or more times as high as current that flows in the electric signal path.

4. The circuit module according to claim 1, further comprising:
a plurality of circuit-module-substrate-side connection parts at the circuit module substrate and opposed to a plurality of large-scale-circuit-board-side connection parts at the base material of the large-scale circuit board; and
a conductive joining part configured to electrically connect the plurality of circuit-module-substrate-side connection parts to the plurality of large-scale-circuit-board-side connection parts.

5. The circuit module according to claim 4, wherein
current that flows in the circuit-module-substrate-side fitting structure part is one hundred or more times as high as current that flows in the plurality of circuit-module-substrate-side connection parts.

6. The circuit module according to claim 4, wherein
the conductive joining part is a solidified body of conductive paste containing silver powder as filler.

7. The circuit module according to claim 4, wherein
the non-conductive thermal adhesive layer and the conductive joining part are solidified bodies of paste containing a main material of a same system, and the conductive joining part is a solidified body of conductive paste containing conductive filler as the main material.

8. The circuit module according to claim 3, wherein
a circuit including the electronic circuit component mounted on the circuit module substrate configures a DC/DC converter configured to receive power from a circuit in or on the large-scale circuit board and supply high current to a circuit in or on the large-scale circuit board through the high current path.

9. The circuit module according to claim 5, wherein
a circuit including the electronic circuit component mounted on the circuit module substrate configures a DC/DC converter configured to receive power from a circuit in or on the large-scale circuit board and supply high current to a circuit in or on the large-scale circuit board through the circuit-module-substrate-side fitting structure part.

10. The circuit module according to claim 8, wherein
the DC/DC converter includes
a plurality of inductors each connected to a current path in series, the current path being configured to supply current to a common output part,
a plurality of switching elements configured to generate switching currents that flow in the respective inductors, and
a switching control circuit configured to control the plurality of switching elements, and the switching control circuit is configured give multi-phase oscillation signals to the plurality of switching elements.

11. A large-scale circuit system comprising:
the circuit module according to claim 1; and
the large-scale circuit board on which the circuit module is mounted.

12. The circuit module according to claim 2, wherein
the circuit-module-substrate-side fitting structure part configures the electric signal path and the high current path of the power system, and current that flows in the high current path is one hundred or more times as high as current that flows in the electric signal path.

13. The circuit module according to claim 2, further comprising:
a plurality of circuit-module-substrate-side connection parts at the circuit module substrate and opposed to a plurality of large-scale-circuit-board-side connection parts at the base material of the large-scale circuit board; and
a conductive joining part configured to electrically connect the plurality of circuit-module-substrate-side connection parts to the plurality of large-scale-circuit-board-side connection parts.

14. The circuit module according to claim 5, wherein
the conductive joining part is a solidified body of conductive paste containing silver powder as filler.

15. The circuit module according to claim 5, wherein
the non-conductive thermal adhesive layer and the conductive joining part are solidified bodies of paste containing a main material of a same system, and the conductive joining part is a solidified body of conductive paste containing conductive filler as the main material.

16. The circuit module according to claim 6, wherein
the non-conductive thermal adhesive layer and the conductive joining part are solidified bodies of paste containing a main material of a same system, and the conductive joining part is a solidified body of conductive paste containing conductive filler as the main material.

17. The circuit module according to claim 9, wherein
the DC/DC converter includes
a plurality of inductors each connected to a current path in series, the current path being configured to supply current to a common output part,
a plurality of switching elements configured to generate switching currents that flow in the respective inductors, and
a switching control circuit configured to control the plurality of switching elements, and
the switching control circuit is configured give multi-phase oscillation signals to the plurality of switching elements.

18. A large-scale circuit system comprising:
the circuit module according to claim 2; and
the large-scale circuit board on which the circuit module is mounted.

19. A large-scale circuit system comprising:
the circuit module according to claim 3; and
the large-scale circuit board on which the circuit module is mounted.

20. A large-scale circuit system comprising:
the circuit module according to claim 4; and
the large-scale circuit board on which the circuit module is mounted.

* * * * *